United States Patent [19]

Okano

[11] Patent Number: 4,775,811
[45] Date of Patent: Oct. 4, 1988

[54] PHASE COMPARATOR

[75] Inventor: Takashi Okano, Saitama, Japan

[73] Assignee: Pioneer Electronic Corporation, Tokyo, Japan

[21] Appl. No.: 51,227

[22] Filed: May 13, 1987

Related U.S. Application Data

[63] Continuation of Ser. No. 718,986, Apr. 2, 1985, abandoned.

[30] Foreign Application Priority Data

Apr. 3, 1984 [JP] Japan ................. 59-66261

[51] Int. Cl.$^4$ ............... H03K 5/00; H03K 5/159
[52] U.S. Cl. ................... 307/514; 307/262; 307/352; 328/133; 328/151
[58] Field of Search .............. 328/133, 151, 155; 307/228, 514, 519, 262, 352, 353

[56] References Cited

U.S. PATENT DOCUMENTS

| | | | |
|---|---|---|---|
| 4,068,181 | 1/1978 | Clark et al. | 328/151 |
| 4,151,473 | 4/1979 | Coleman et al. | 328/151 |
| 4,216,396 | 8/1980 | Balaban et al. | 328/151 |
| 4,358,736 | 11/1982 | De Boer | 328/133 |
| 4,370,616 | 1/1983 | Rijckaert | 328/133 |
| 4,523,150 | 6/1985 | Hogeboom | 328/133 |

Primary Examiner—Stanley D. Miller
Assistant Examiner—Timothy P. Callahan
Attorney, Agent, or Firm—Sughrue, Mion, Zinn, Macpeak & Seas

[57] ABSTRACT

A phase comparison circuit for producing a voltage error signal proportional to the difference in phase between a reference signal and an input signal. The reference signal is in the form of a sawtooth wave signal having a fixed frequency and fixed period. The input signal may vary widely in frequency. Sample pulses are derived from the input signal and are used to sample the ramps of the sawtooth signal to produce the error signal. When the frequency of the input signal differs from that of the reference signal to such an extent that the sample pulses do not occur during the ramps of the sawtooth signal, the sawtooth signal is repeatedly shifted in phase by one of two fixed amounts, depending upon the direction of the frequency difference, until the sample pulses occur during the ramps of the sawtooth signal.

8 Claims, 4 Drawing Sheets

FIG. 9
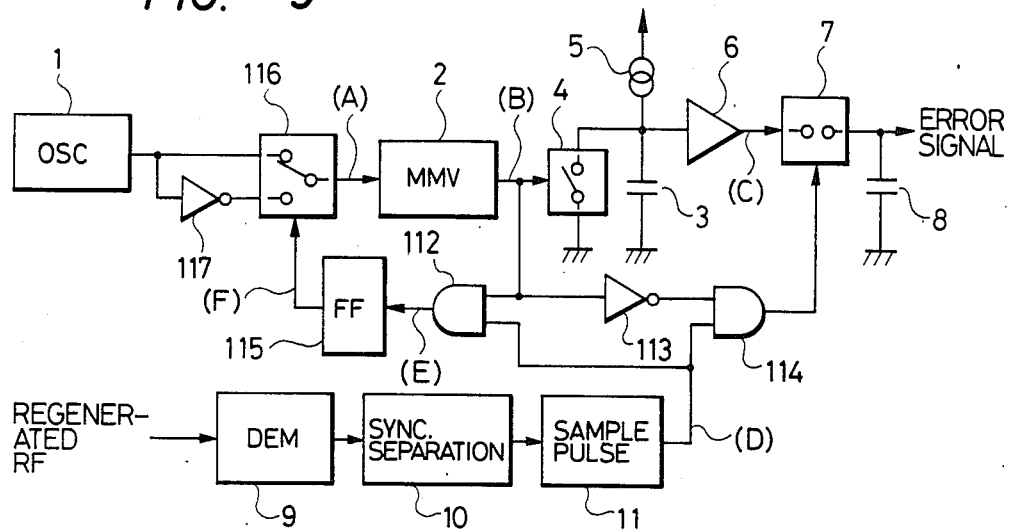
FIG. 10 (A), (B), (C), (D), (E), (F)
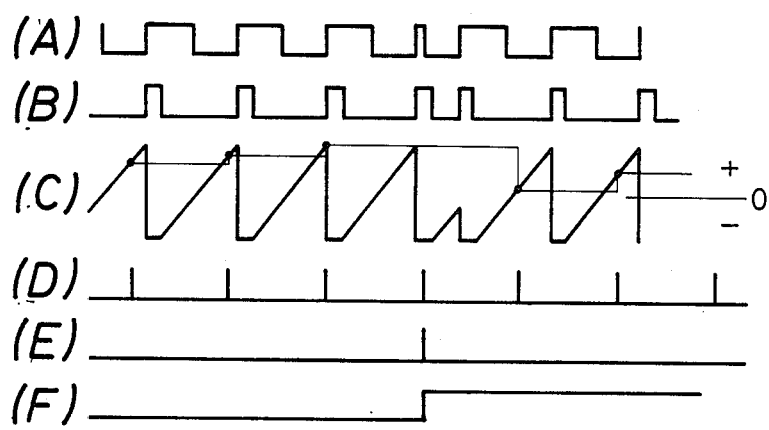
FIG. 11 (A)
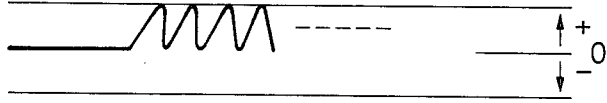
FIG. 11 (B)
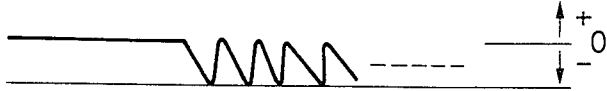

PHASE COMPARATOR

This is a continuation of application Ser. No. 718,986, filed Apr. 2, 1985, now abandoned.

BACKGROUND OF THE INVENTION

1. Field of the Invention

This invention relates to a phase comparator and more particularly to a phase comparator for use in a servo system to maintain the speed of revolution and phase of rotary apparatus, such as a video disk player, to be constant.

2. Description of the Related Art

A conventional phase comparator has a circuit configuration as shown in FIG. 1. A reference signal from the reference oscillator 1 is converted by means of a monostable multivibrator (MMV) 2 into a pulse train signal (A) having a fixed pulse width. Switch 4 which is on/off controlled by this pulse signal discharges the electric charge in capacitor 3. This capacitor is charged by the electric current source 5 while switch 4 is off. The resulting voltage (B) at the terminal of capacitor 3 is applied to sample switch 7 through buffer 6. This sample output is held by capacitor 8 whose hold output (D) represents a phase error signal.

An RF signal of a signal to be regenerated, such as in a video disk player or the like from which a phase error signal is to be detected, is demodulated by the demodulator 9 and supplied to the synchronization signal separator 10. With the separated synchronization signal applied to the sample pulse generator 11, the sample pulse (C) is generated to control the switch 7.

FIG. 2 shows a series of waveforms illustrating the operation of the circuit shown in FIG. 1, in which waveforms (A) through (D) correspond to the waveforms of signals (A) through (D) discussed in connection with FIG. 1. Since the phase of the sample pulse changes in response to changes in the phase, if any, of the video signal to be regenerated, the sample point of the sawtooth signal changes causing the error signal level to vary in response to the sample point change.

In the circuit configuration, as described above, a normal error signal may be generated if the frequency of the reference signal is approximately equal to that of the regenerative synchronizing signal. If there is a large difference between the two frequencies, however, an accurate error signal cannot be generated due to the reason described below.

The sample pulse-to-pulse interval gradually increases as the frequency of the signal to be regenerated decreases. For example, the level of the error signal (D) increases from zero to the positive side as shown in FIG. 3 until it reaches the peak of the slope. Then, it reverses to the negative side. The level goes up again allowing the sampling operation to be performed from the lowest part of the slope. Accordingly, a signal having alternating positive and negative levels, as shown in FIG. 3, is produced as a phase error signal. The larger the frequency difference is, the smaller the positive and negative repetition cycle becomes. For the above reason, in the situation of controlling the servo rotary system of a signal regenerating apparatus, such as a video disk player, rotation control will be made difficult and the synchronization operation of the servo system will be disabled.

Referring now to FIG. 4, a frequency detector 30, in addition to the phase error detector 20 such as that described in connection with FIG. 1, is used. In such a system, the output signals from these two detectors are added by adder 31 whose output is used as a servo signal. With the inclusion of the frequency detector 30, the average value of the phase comparator output is zero although the phase comparator output alternately changes its polarity between the positive and negative values. Therefore the output of the frequency comparator 30 is used to control the rotary system to be synchronized with the synchronizing speed; then, the output of the phase comparator is applied. When the difference between the rotary system and the synchronizing speeds becomes small, the servo operation is initiated.

There is a disadvantage with this method, however, because two detecting means are necessary and complicated adjustment for accurate servo operation is required due to the mutual interference between the offsets of the two detecting means.

A potential problem arises which may be caused by phase shift at the time of the servo lock when two systems of detecting circuits, as shown in a conventional embodiment in FIG. 4, are used and there is a difference between the usual stability points.

SUMMARY OF THE INVENTION

It is an object of the present invention to provide a phase comparator which is able to generate an accurate phase error signal with a circuit of simple configuration and which also includes a frequency detecting feature.

The phase comparator according to one embodiment of the present invention includes a means to sample and hold the level of a sawtooth signal by use of a sample pulse in synchronization with a fixed signal to which phase comparison is made; a means to use this hold output as a phase error signal; and a means to detect that the phase of the sample pulse is out of a slope width of the sawtooth signal and to shift the sawtooth signal.

The phase comparator according to another embodiment of the present invention includes a means to sample and hold the level of a sawtooth signal to which phase comparison is made; a means to use this hold output as a phase error signal; and a sawtooth signal generating means comprising: a reference oscillator to generate a reference signal having fixed frequency; a dividing means to divide this reference signal; a means to detect that the phase of said sample pulse is out of a slope width of said sawtooth signal; a means to generate a response to this detected output a shift pulse having a pulse width of a fixed period of time; a gate means to stop the supply of said reference signal to said dividing means only for a period of time of the generation of said shift pulse; so as to generate said sawtooth signal in accordance with the output pulse from said dividing means.

BRIEF DESCRIPTION OF THE DRAWING

The objectives of the present invention will be clear by the following desciption with reference to the accompanying Drawing, in which:

FIG. 9 is block diagram of another embodiment of the phase comparator according to the present invention.

FIG. 10 through FIGS. 11 (A) and 11 (B) show wave forms illustrating the operation of the circuit in FIG. 9.

DESCRIPTION OF THE PREFERRED EMBODIMENT(S)

Figure 1:
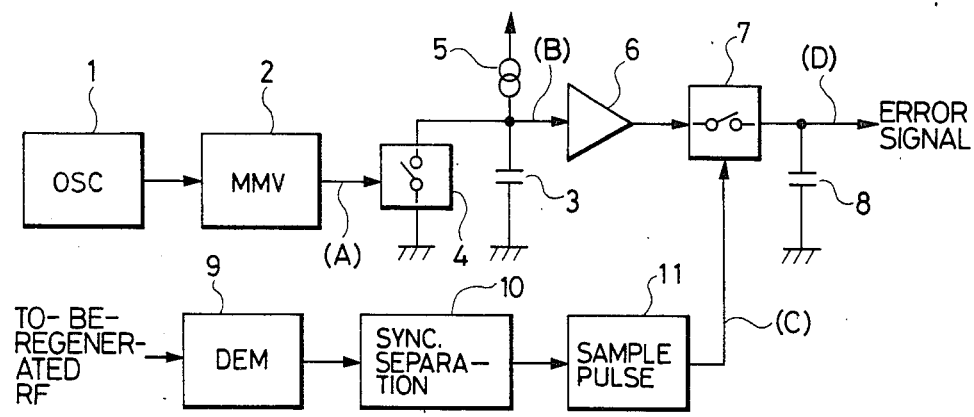
FIG. 1 is a block diagram which shows a conventional phase comparator.
Figure 2:
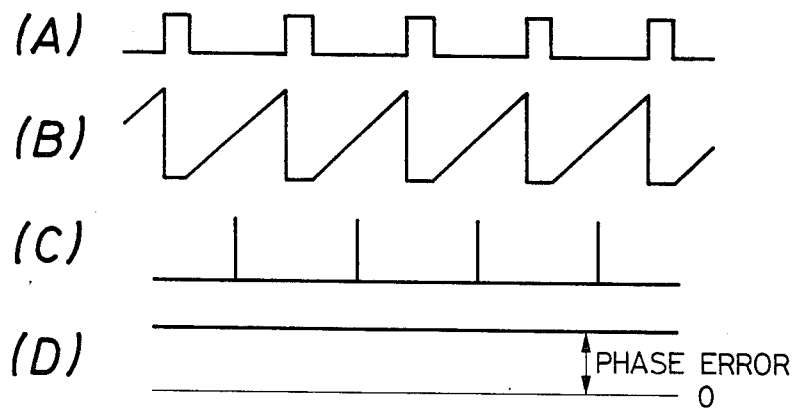
FIG. 2 and FIG. 3 show waveforms illustrating the operation of the circuit in FIG. 1.
Figure 3:
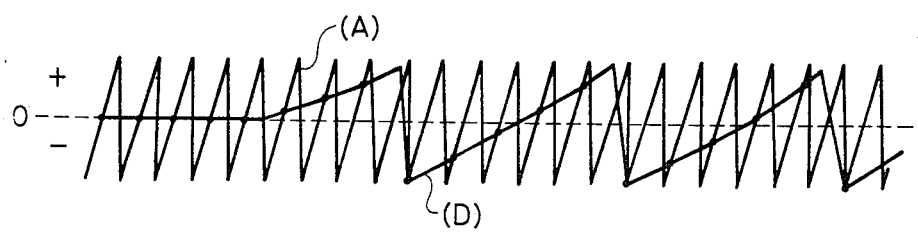
Figure 5:
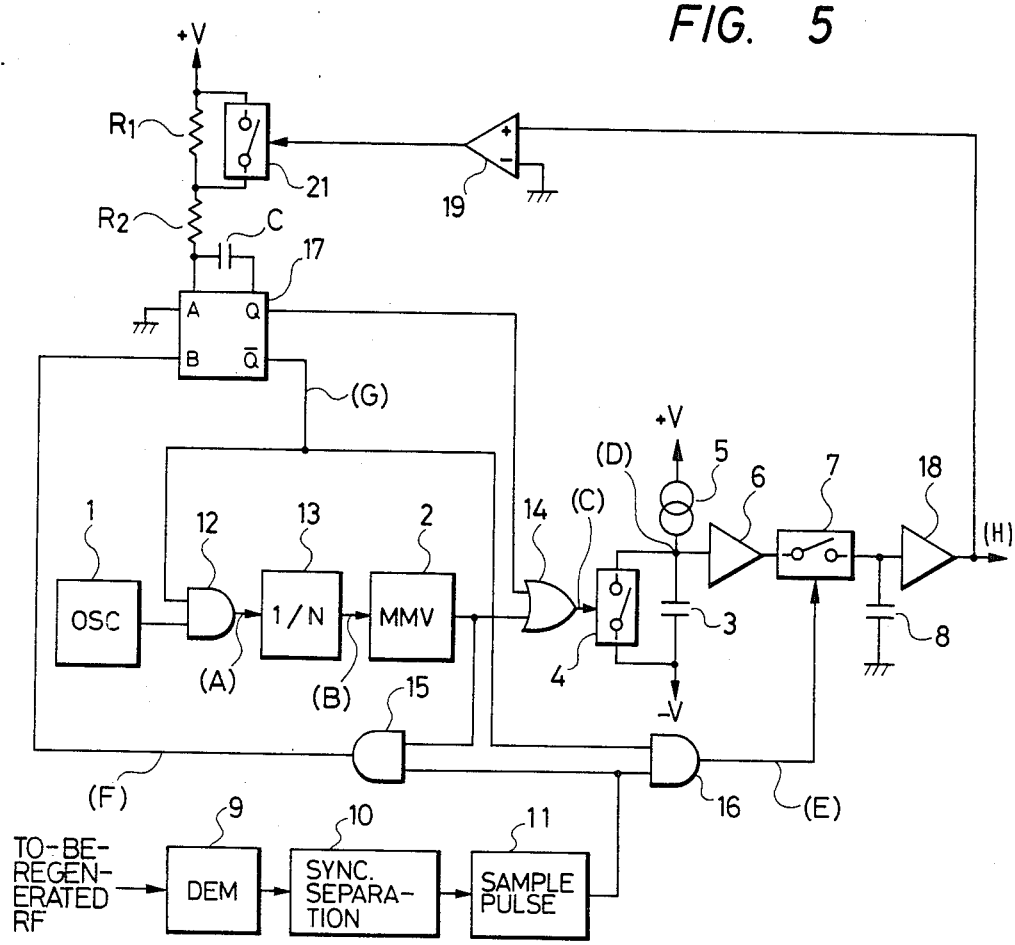
FIG. 5 is a block diagram of an embodiment of the phase comparator according to the present invention.

A preferred embodiment will be understood with reference to the accompanying Drawing in which FIG. 5 is a block diagram of the embodiment of the present invention applied to a video disk player, for example. The components shown in this Figure corresponding to those shown in FIG. 1 are represented by the same indicia. In FIG. 5, the reference oscillator 1, such as a crystal oscillator for example, generates a reference signal having a frequency N-times that of the video horizontal line frequency. The generated reference signal becomes one input to the 2-input AND gate 12. The reference signal (A) constituting the output of the AND gate 12 is divided by a value N in counter 13. The divided signal becomes a pulse signal (B) of the horizontal line frequency fH and is supplied to the MMV 2. The output of the MMV 2 is one input to the 2 input OR gate 14 whose output (C) is provided as a control signal to switch 4.

The sample pulse from the sample pulse generator 11 is provided as one input to each of the 2-input AND gates 15 and 16. The output of the MMV 2 is supplied as the other input to AND gate 15. The output (F) of AND gate 15 serves as a trigger input to the MMV 17. The MMV 17 is triggered by the rising edge of the output of AND gate 15. Its Q output becomes the other input to the OR gate 14 while its $\overline{Q}$ output becomes the other input to each of AND gates 12 and 16. The output (E) from AND gate 16 becomes a control signal to switch 7.

The output from the capacitor 3 which is a sawtooth signal (D) is applied through buffer 6 to sample switch 7, the sampled output from which is held by capacitor 8. It is noted that the output held in capacitor 8 passes through buffer 18 to become a phase error signal. This error signal is provided as comparison input to the comparator 19, and the output of comparator 19 serves as a control signal to switch 21. This switch 21, attached externally to the MMV 17, is connected in parallel with resistor $R_1$ in a time constant circuit (consisting of the resistors $R_1$ and $R_2$ and capacitor C) which determines the pulse width of the output pulse (G) from the MMV 17.

Figure 6:
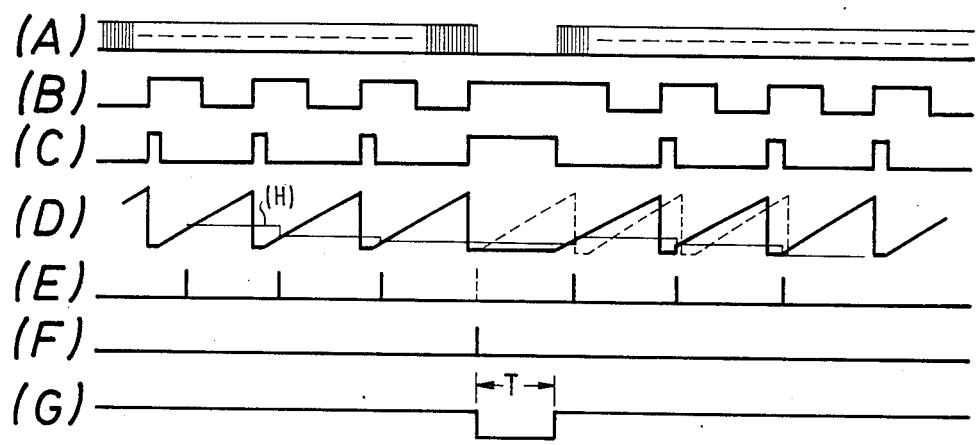
FIG. 6 through FIG. 8 show waveforms illustrating the operation of the circuit in FIG. 5.
Figure 7:
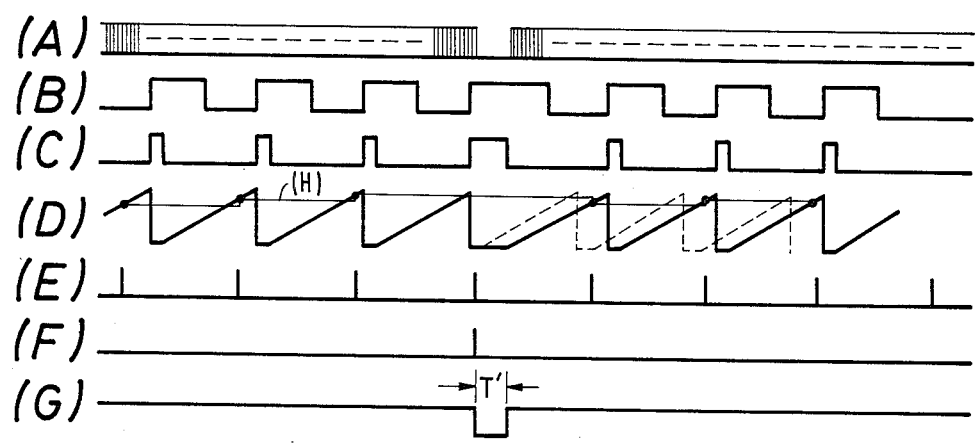

Referring now to the waveforms in FIG. 6 and FIG. 7, the circuit operation of the phase comparator according to the present invention is described, as follows. In FIG. 6 and FIG. 7, (A) through (G) correspond to the waveforms of the signals (A) through (G) of each part of the circuit in FIG. 5, respectively discussed hereinabove.

FIG. 6 provides waveforms showing timing information when the speed of revolution of the video disk is high with respect to the synchronous revolving speed, i.e., the situation when the frequency of the video signal to be regenerated is higher than the reference frequency. In this case, since the sample pulse occurrence cycle is shorter than the sawtooth signal cycle, the sampling is performed with the sample point gradually moving downward along the slope as shown in FIG. (6) D. Therefore, the level of the phase error signal at the output of buffer 18 moves from zero toward the negative side. Since the output from comparator 19 is at a low level at this time, switch 21 is in the open state. The sample pulse is generated during the occurrence of the output pulse from the MMV 2 when the sample point reaches the lowest part of the slope. Therefore, the two inputs of AND gate 15 go to a high level; as a result, the output (F) of the AND gate 15 appears and its rising edge triggers MMV 17. The pulse width T of the Q output and the $\overline{Q}$ output (G) of the MMV 17 is determined by $(R_1+R_2) \times C \times K$ and it is set a little bit shorter than the time To for one horizontal line sweep time (63.556 u sec in case of the NTSC system, or 64.0 u sec in case of the PAL system).

Since the reference signal from reference oscillator 1 to the counter 13 is stopped by the occurrence of the $\overline{Q}$ output (G) of the MMV 17 at AND gate 12, the count operation of the divider counter 13 also is stopped during this time. This is not the divider counter reset state but the hold state. This causes the counter output to be delayed by a period of time equivalent to the pulse width T of the $\overline{Q}$ output (G) of MMV 17. It occurs at the same time that the Q output of MMV 17 is supplied through OR gate 14 to switch 4. Consequently, the sample pulse again is held within the slope since the sawtooth signal (D) is phase-shifted by the above pulse width T. The AND gate 16 is provided to prevent the sample and hold operation from being performed by the sample pulse (shown by a dotted line in FIG. 6 (E)) off the slope or ramp of the sawtooth signal (D).

Although the slope part or ramp of the sawtooth signal is reset by supplying the Q output of MMV 17 to switch 4 during the shift period of the sawtooth signal, this aspect of the invention is not indispensable and resetting the slope part of the sawtooth signal may be omitted. In this case, a high-level sampling takes place during the above shift period; however, this will not cause any practical problems because the phase error signal level is averaged.

By way of contrast, FIG. 7 is a timing chart which shows the situation when the speed of revolution of the video disk is low with respect to the synchronous revolving speed, i.e., the situation when the frequency of the video signal to be regenerated is lower than the reference frequency. In this case, although the sample point gradually moves upward along the slope part of the sawtooth signal, the output of the comparator 19 is at a high level causing the switch 21 to be set to the closed state since the polarity of the phase error signal at this time is positive. Consequently, the resistor $R_1$ is shorted causing the pulse width T' of the output pulse of the MMV 17 to be represented by $R_2 \times C \times K$. Therefore, the amount of the shift of the sawtooth signal (D) is set to a smaller value than that of the case described previously. The overall circuit operation, however, is the same as explained with respect to the previous situation.

The present invention operates by detecting by means of AND gate 15 that the sample pulse is not within the slope or ramp width of the sawtooth signal and stopping the supply of the reference signal to the dividing counter 13 for a fixed period of time by triggering the MMV 17 by use of the above detection output of gate 15.

Figure 8:
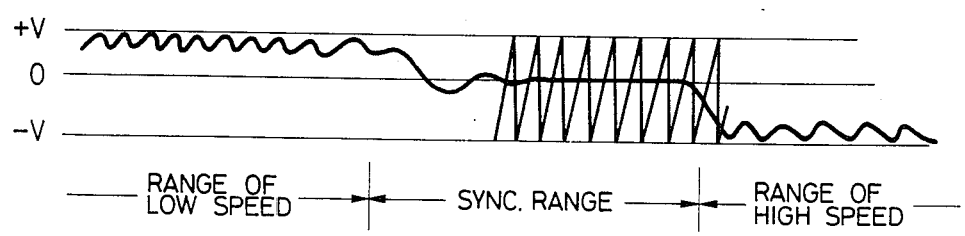

As shown in FIG. 8, the phase comparator is enabled to work as a speed detector in the non-synchronization mode because the phase error signal is held at a negative value if the speed of revolution of the video disk is high with respect to the reference synchronization signal. Conversely, the phase error signal is held at a positive value if the speed of revolution of the video disk is low with respect to the reference synchronization signal. Positive and negative error signals are both obtained when the synchronization mode is established.

In addition, it is possible to always hold the sample pulse in the slope part of the sawtooth signal by changing the amount of the shift of the sawtooth signal depending on the whether the speed of revolution of the video disk is relatively high or low.

In the above embodiment, a means to detect whether the phase of the sample pulse is not within the slope width of the sawtooth signal is provided. The circuit is so configured by use of AND gate 15 such that the coincidence between the occurrences of the timing of the sample pulse and the timing of the output of the MMV 2 is detected. The circuit configuration is not limited to the above embodiment, however. Another possible circuit configuration, in which the amplitude of a phase error signal to be output is compared, is performed by use of a window comparator. The output at the time the amplitude exceeds a fixed range is used as a detection output.

Also, the circuit configuration first described hereinabove is made to block the sample pulse, by the use of AND gate 16, occurring during the time the sawtooth signal is shifted, but this is not an indispensable aspect of the circuit according to the present invention. The reason is that, even if this pulse is not blocked, there will be no problem because the low level of the slope part is newly sampled by this pulse for the situation described in connection with FIG. 6. On the contrary, for the situation described in connection with FIG. 7, the low level of the slope part is sample-held by this pulse and the high level is sample-held in the sampling before and after this pulse. Therefore, the low level appears only once due to the shift operation while the level is sampled in succession. However, as a frequency or speed detecting feature, a decision is made by the polarity of the whole sample value, that is, by the low-frequency component of the sample value. Therefore, there will be no influence on the detecting feature even if the sample pulse at the time of the shift is not blocked.

Another embodiment will be described with reference to FIG. 9 through FIGS. 11(A) and 11 (B). The components shown in FIG. 9 corresponding to those shown in FIG. 1 are represented by the same indicia.

In FIG. 9, the sample pulse (D) is provided as a control signal to the switch 7 through the 2-input AND gate 114. The output((B) from the MMV 2 is provided as the other input to the gate 114 through the inverter 113. The sample pulse (D) and the MMV output (B) are also provided as two inputs to the AND gate 112. The FF (flip-flop) 115 is set/reset by the gate output (E) from the AND gate 112. The switch 116 is controlled by the output (F) from the FF 115. The output from the reference oscillator 1 and the output from the reference oscillator through the inverter 117 are selected by the switch 116 and the selected one is provided as the trigger signal (A) to the MMV 2. The other components in FIG. 9 are identical to those in FIG. 1 and the description of the components will be omitted.

FIG. 10 provides waveforms showing the operation of the circuit in FIG. 9. In FIGS. 10, (A) through (F) correspond to the waveforms of the signals (A) through (F) of each part of the circuit in FIG. 9. If the frequency of the signal to be regenerated decreases with respect to that of the reference signal, the sample point moves upward along the slope of the sawtooth signal. At last, a sample pulse is generated in the discharge period of the capacitor 3. This situation is detected by the AND gate 112 and the output from the FF 115 is inverted, so that the polarity of the reference signal used as the trigger signal for the MMV 2 is inverted. Accordingly, the phase of the sawtooth signal is shifted to the extent of a half period and the sample pulse is held at about the center of the slope of the sawtooth signal. Accordingly, the sample point again moves upward along the slope and such operation is repeated. As shown in FIG. 11 (A), if the frequency of the signal to be regenerated is lower than that of the reference signal, the sample point is held at a positive value. On the contrary, if the frequency of the signal to be regenerated is higher than that of the reference signal, the sample point moves downward along the slope. When the sample point reaches the period of the discharge of the capacitor, such situation is detected by the circuit including the inverter 113 and the gate 114, so that the sample pulse is blocked and the sampling is not performed. Accordingly, since the sawtooth signal is shifted to the extent of a half period, the sample points are held at a negative value as a whole, as shown in FIG. 11 (B).

According to the embodiment described above, an error signal having one-directional polarity is generated when a frequency gap arises, so that it is also possible to detect the frequency.

Figure 4:
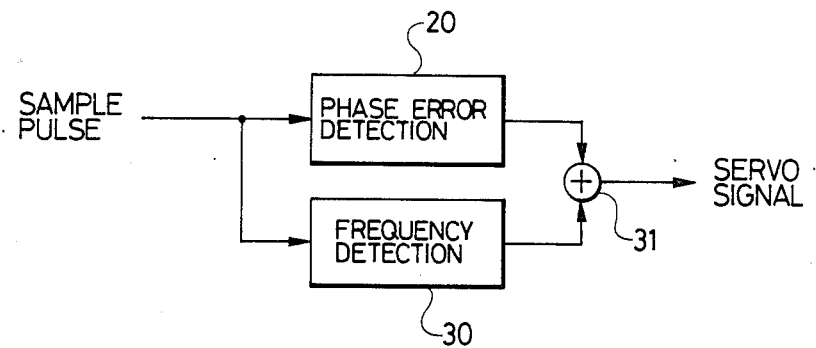
FIG. 4 is a block diagram of a conventional rotary control system.

As described hereinabove, the present invention provides a phase comparator with the advantage of achieving accurate speed control on rotary systems as well as simple circuit configuration because this phase comparator is provided with a frequency detection feature in addition to a phase comparison feature by using only one detecting means. Another advantage of this invention is to prevent a problem which may be caused by phase shift at the time of the servo lock when two systems of detecting circuits, as shown in the conventional embodiment in FIG. 4, are used and there is a difference between the mutual stability points (desired value).

It is to be understood that the present invention is not limited in its application to a video disk player, since the invention is capable of other embodiments such as the time axis control system of various recorded information regenerating means.

What is claimed is:

1. A phase comparator for comparing the phase of an input signal with the phase of a reference signal and for generating a phase error signal which is indicative of the phase difference, comprising means for generating said reference signal having a fixed period; sample and hold means receiving a sample signal pulse for sampling said reference signal and holding a level thereof as said phase error signal, said sample signal pulse being synchronized with said input signal which is to be phase-compared with said reference signal; detecting means, responsive to said reference signal and said sample signal pulse, for producing a detection signal when the phase of said sample signal pulse is not within said period of said reference signal; means for shifting said reference signal; and control means, responsive to said phase error signal and to said detection signal, to produce a control signal, which is applied to said shifting means, for shifting said reference signal, generated by said generating means, until said sample signal pulse occurs within said period.

2. A phase comparator as claimed in claim 1, in which said reference signal is a sawtooth signal, and in which said means for shifting said sawtooth signal shifts said sawtooth signal to the extent of half the period of said sawtooth signal.

3. In a phase comparator comprising means for generating a sawtooth signal, means for sampling a voltage level of said sawtooth signal, generated by said generating means, with a sample signal pulse synchronized with an input signal which is to be phase-compared with a reference signal from which said sawtooth signal is derived, and means for holding the voltage level as a phase error signal indicative of the phase difference between said reference and input signals, wherein said comparator further comprises:

a reference oscillator to generate the reference having a fixed reference frequency;

means, coupled to said reference oscillator, for dividing said reference frequency and providing output pulses;

means, responsive to said sample signal pulse and to said output pulses, for detecting when the phase of said sample signal pulse is not within a fixed slope width of said sawtooth signal and producing a corresponding detection pulse;

means for generating, in response to said phase error signal and to the detection pulse, a shift pulse having a pulse width of a first fixed period of time when the frequency of said input signal is higher than that of said reference signal; and gate means, responsive to said shift pulse, to stop the supply of said reference signal to said dividing means for a period equal to the time of generating of said shift pulse.

4. A phase comparator as claimed in claim 3, in which said means for generating said sawtooth signal repeatedly operates in response to either an output pulse from said dividing means or to said shift pulse, so that said signal pulse remains within said fixed slope width.

5. A phase comparator as claimed in claim 3, further comprising circuit means, responsive to said phase error signal, for changing said pulse width to a different fixed period of time when a frequency of said input signal is low with respect to the reference frequency.

6. A method of detecting the phase difference between a train of reference pulses and a train of input pulses, comprising steps of:

generating from the reference pulses a train of reference sawtooth voltage signals of fixed repetition frequency and each having a voltage ramp with a fixed period;

sampling, with sampling pulses derived from said input pulses, the voltage ramps upon the occurrence of each input pulse, and holding the sampled voltage as a phase difference error signal;

detecting a condition wherein the difference in frequencies of the reference pulses and input pulses is such that the sample pulses do not occur within the rise times of corresponding ramps of the sawtooth signals; and repeatedly shifting the phase of said reference pulses relative to said input pulses until said sampling pulses occur during said ramps.

7. A phase comparator as claimed in claim 1, wherein said sample and hold means samples, and holds a level of, a sawtooth signal as said phase error signal; and further comprising sawtooth generating means for generating the sawtooth signal in response to said reference signal.

8. A phase comparator for comparing the phase of an input signal with the phase of a reference signal and for generating a phase error signal which is indicative of the phase difference, comprising means for generating said reference signal having a fixed period, said generating means being responsive to a control signal for shifting the phase of said reference signal; sawtooth signal generating means for generating a sawtooth signal in response to said reference signal; sample and hold means receiving a sample signal pulse for sampling said sawtooth signal and holding a level thereof as said phase error signal, said sample signal pulse being synchronized with said input signal which is to be phase-compared with the said reference signal; detecting means, responsive to said reference and said sample signal pulse, for producing a detection signal when the phase of said sample signal pulse is not within said period of said reference signal; and means, responsive to said detection signal and said phase error signal, to produce the control signal for shifting said reference signal until said sample signal pulse occurs within said period.

* * * * *